US008986033B2

(12) United States Patent
Berger et al.

(10) Patent No.: US 8,986,033 B2
(45) Date of Patent: Mar. 24, 2015

(54) CONNECTION MODULE BEING CAPABLE OF SERVING AS A BUS

(75) Inventors: Timo Berger, Oerlinghausen (DE); Stephan Fehling, Lage (DE); Georg Kulturidi, Bielefeld (DE); Daniela Luecke-Janssen, Lotte (DE); Matthias Niggemann, Doerentrup (DE); Klaus Pueschner, Detmold (DE); Michael Schnatwinkel, Herford (DE); Ralf Schumacher, Lemgo (DE); Klaus Wohlgemuth, Kalletal (DE); Gordon Opitz, Enger (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 217 days.

(21) Appl. No.: 13/577,183

(22) PCT Filed: Mar. 25, 2011

(86) PCT No.: PCT/EP2011/054606
§ 371 (c)(1),
(2), (4) Date: Oct. 4, 2012

(87) PCT Pub. No.: WO2011/120881
PCT Pub. Date: Oct. 6, 2011

(65) Prior Publication Data
US 2013/0027890 A1 Jan. 31, 2013

(30) Foreign Application Priority Data

Mar. 31, 2010 (DE) .................... 20 2010 004 410 U

(51) Int. Cl.
*H01R 9/26* (2006.01)
*H05K 7/14* (2006.01)

(52) U.S. Cl.
CPC ............ *H05K 7/1478* (2013.01); *H05K 7/1468* (2013.01); *Y10S 439/912* (2013.01); *Y10S 439/928* (2013.01)
USPC ............ 439/341; 439/716; 439/912; 439/928

(58) Field of Classification Search
CPC ................................. H01R 9/26; H01R 13/629
USPC .......................... 439/341, 715–716, 928, 912
See application file for complete search history.

(56) References Cited

U.S. PATENT DOCUMENTS 4,313,147 A * 1/1982 Uchida et al. ................. 361/119
4,472,764 A * 9/1984 Richard et al. ................ 361/775

(Continued)

FOREIGN PATENT DOCUMENTS

DE 23599452 A1 6/1973
DE 23 59 452 A1 6/1975

(Continued)

*Primary Examiner* — Neil Abrams
(74) *Attorney, Agent, or Firm* — Lawrence E. Laubscher, Sr.; Lawrence E. Laubscher, Jr.

(57) ABSTRACT

An electrical module includes a rectangular carrier frame adapted for vertical transverse mounting on a horizontal support rail, a housing for mounting an electrical component in an open-top chamber contained in the carrier frame, and a rectangular electrical connector mounted on and extending across the upper end of the carrier frame, thereby to enclose the component and afford electrical connection with upper terminals thereof. The connector is pivotally connected at one end with the carrier frame for displacement between open and closed positions, and a fastener device serves to lock the connector in the closed position to the carrier frame. Alternatively, the ends of the connector are removably fastened to the carrier frame. Lower terminals of the component are connected with lower contacts arranged at the bottom of the chamber for connection with corresponding lower contacts of adjacent modules mounted in stacked relation on the support rail.

13 Claims, 16 Drawing Sheets

(56) References Cited

U.S. PATENT DOCUMENTS

| | | | |
|---|---|---|---|
| 4,738,632 A * | 4/1988 | Schmidt et al. | 439/341 |
| 4,772,211 A * | 9/1988 | Asick et al. | 439/65 |
| 4,878,860 A * | 11/1989 | Matsuoka | 439/716 |
| 4,956,747 A * | 9/1990 | Beer et al. | 361/728 |
| 5,043,847 A * | 8/1991 | Deinhardt et al. | 361/736 |
| 5,588,881 A * | 12/1996 | Eggert et al. | 439/709 |
| 5,615,079 A * | 3/1997 | Eggert et al. | 361/637 |
| 5,629,831 A * | 5/1997 | Eggert et al. | 361/624 |
| 5,641,313 A * | 6/1997 | Hohorst | 439/709 |
| 5,655,922 A * | 8/1997 | Dux et al. | 439/213 |
| 5,716,241 A * | 2/1998 | Hennemann et al. | 439/716 |
| 5,722,862 A * | 3/1998 | Glathe et al. | 439/709 |
| 5,724,421 A * | 3/1998 | Tuvy et al. | 379/413.02 |
| 6,033,264 A * | 3/2000 | Feye-Hohmann | 439/631 |
| 6,172,877 B1 * | 1/2001 | Feye-Hohmann et al. | 361/759 |
| 6,392,319 B1 * | 5/2002 | Zebermann et al. | 307/147 |
| 6,418,027 B1 * | 7/2002 | Suzuki et al. | 361/729 |
| 6,425,770 B1 * | 7/2002 | Lostoski et al. | 439/76.1 |
| 6,456,495 B1 * | 9/2002 | Wieloch et al. | 361/729 |
| 6,572,403 B2 * | 6/2003 | Reimund et al. | 439/507 |
| 6,802,737 B2 * | 10/2004 | Bergner et al. | 439/532 |
| 6,840,819 B2 * | 1/2005 | Bet et al. | 439/716 |
| 6,848,951 B1 * | 2/2005 | Bechaz et al. | 439/716 |
| 6,869,320 B2 * | 3/2005 | Haas et al. | 439/701 |
| 6,940,021 B2 * | 9/2005 | Pohl et al. | 174/137 R |
| 6,945,828 B2 * | 9/2005 | Kamei et al. | 439/717 |
| 7,230,833 B1 * | 6/2007 | Sickels | 361/747 |
| 7,513,800 B2 * | 4/2009 | Nolting et al. | 439/620.15 |
| 7,658,653 B2 * | 2/2010 | Diekmann et al. | 439/715 |
| 7,865,326 B2 * | 1/2011 | Johnson et al. | 702/127 |
| 8,128,435 B2 * | 3/2012 | Trinh | 439/661 |
| 8,602,816 B2 * | 12/2013 | Donhauser et al. | 439/532 |
| 8,668,518 B2 * | 3/2014 | Wu | 439/532 |
| 2013/0027890 A1 * | 1/2013 | Berger et al. | 361/747 |
| 2013/0102164 A1 * | 4/2013 | Sip | 439/38 |

FOREIGN PATENT DOCUMENTS

| | | |
|---|---|---|
| DE | 44 02 002 A1 | 7/1995 |
| DE | 196 51 961 A1 | 6/1998 |
| DE | 199 64 156 A1 | 9/2000 |
| EP | 0 364 618 B1 | 10/1993 |
| EP | 0909122 B1 | 4/1999 |
| EP | 0709933 | 11/2000 |
| EP | 0 909 122 B1 | 3/2003 |
| EP | 1 622 440 A1 | 2/2006 |

\* cited by examiner

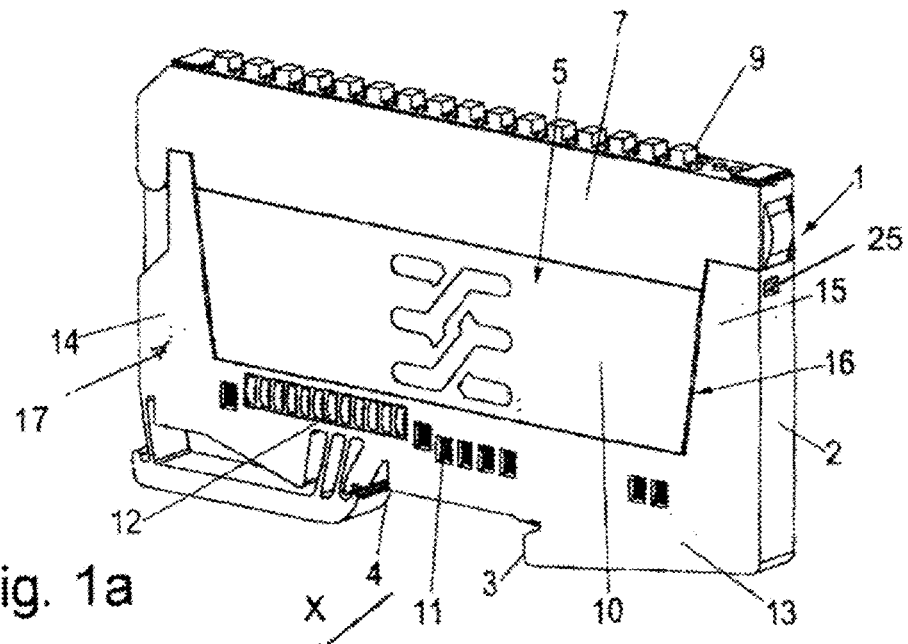
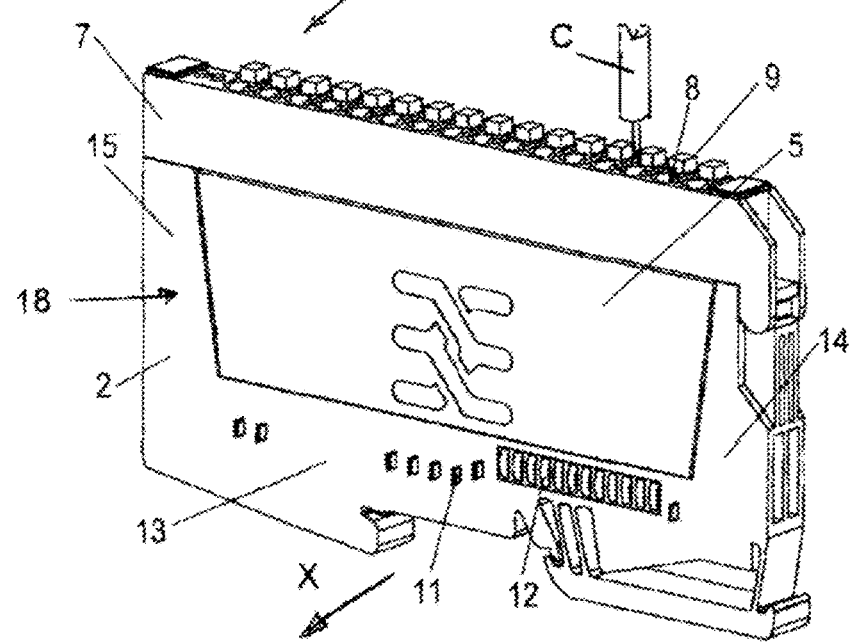
Fig. 1a
Fig. 1b

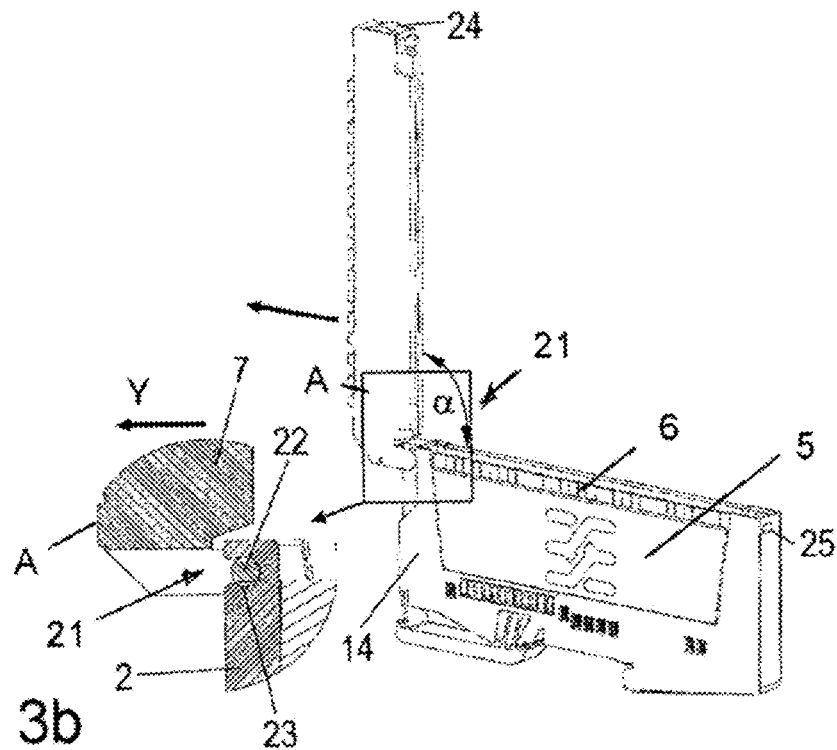
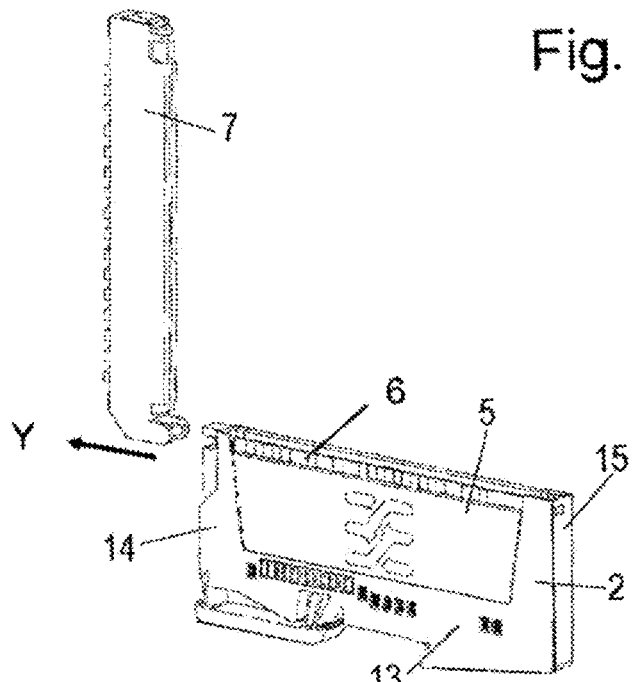
Fig. 3a
Fig. 3b
Fig. 3c

CONNECTION MODULE BEING CAPABLE OF SERVING AS A BUS

REFERENCE TO RELATED APPLICATIONS

This application is a continuation application of International Application No. PCT/EP2011/054606 filed Mar. 25, 2011, claiming priority of the German application No. 20 2010 004 410.3 filed Mar. 31, 2010.

BACKGROUND OF THE INVENTION

1. Field of the Invention

An electrical module includes a rectangular carrier frame adapted for vertical transverse mounting on a horizontal support rail, a housing for mounting an electrical component in an open-top chamber contained in the carrier frame, and a rectangular electrical connector mounted on and extending across the upper end of the carrier frame, thereby to enclose the component and afford electrical connection with the upper terminals thereof. The module serves for the control and/or monitoring of technical processes and/or for industrial and/or building automation.

2. Description of Related Art

Connecting modules are known by way of example from the European patents Nos. EP 0 364 618 B1, EP 95 113 730 A1, and EP 95 113 730 A1, and the German patents Nos. DE 44 02 002 A1 and DE 199 64 156 A1. In the European patent No. EP 98 113 730, the connecting modules have a somewhat block-like structure with a plurality of connecting levels for connection of external conductors; on the other hand, the German patent No. DE 199 64 156 A1 discloses a mixed design with disc-like units with in each case two mutually parallel connecting levels and block-like units with a plurality of connecting elements.

The typical module of the European patent No. EP 0 364 618 B1—which is owned by the instant Applicant—displays base terminal carriers that are inserted into the push contacts, which contact each other when they are in an aligned state and which thus form bus lines that pass in this way over several modules. Pin-and-socket connectors are used for contacting a printed circuit board of an electronic unit that can be stuck on the base terminal carriers.

In contrast to the known devices of the prior art, the present invention was developed to provide a connecting module that can be handled in a simple manner and that is particularly clearly structured and whose structure will protect the electronic unit well.

SUMMARY OF THE INVENTION

Accordingly, a primary object of the invention is to provide an electrical module including a rectangular carrier frame adapted for vertical transverse mounting on a horizontal support rail, a housing for mounting an electrical component in an open-top chamber contained in the carrier frame, and a rectangular electrical connector mounted on and extending across the upper end of the carrier frame, thereby to enclose the component and afford electrical connection with upper terminals of the component.

According to a more specific object of the invention, the electrical connector is pivotally connected at one end with the carrier frame for displacement between open and closed positions, and a fastener device serves to lock the connector in the closed position to the carrier frame. Alternatively, the ends of the removable connector are fastened to the carrier frame.

Another object of the invention is to provide lower contacts arranged at the bottom of the chamber that are connected with terminals at the lower portion of the electrical component. These lower contacts are arranged opposite openings contained in the side walls of the carrier frame for connection with the corresponding lower contacts of adjacent modules mounted in stacked relation on the support rail.

The present invention provides a connecting module with a disc-like structure having the following features: a base terminal carrier for attachment to an assembly base, preferably with catch means for connection with a support rail, an electronic housing that can be mounted upon the base terminal carrier with at least one printed circuit board, a connector unit that can be attached directly upon the base terminal carrier with a housing having at least one row of connectors for the connection of external conductors, whereby the electronic housing is framed by the base terminal carrier and the connecting unit in the manner of a circular frame. This frame is in each case preferably open in the direction of alignment so that the electronic housing in this area will also form a part of the outer wall of the connecting module. The electronic housing can be inserted in the frame, which can be opened. It is also particularly well protected and secured toward the outside in the frame.

According to an advantageous variant of the invention, the base terminal carrier has a U-shaped structure with a base leg and side legs defining a receiving space into which the electronic housing and the electrical component can be inserted. In that space, the electronic housing and the electrical component are well protected toward three sides even though the connector unit has not yet been installed.

It is practical and efficient when the connecting unit is arranged pivotally and/or separably fastened upon the base terminal carrier.

As an alternative embodiment, the side legs may be designed so that they have different lengths, but in that case, one would not mold the side legs upon the base terminal carrier, but rather upon the connecting unit so that the U-shaped receiving space is formed in the connecting unit.

As a further alternative, it would furthermore be conceivable to design the side legs upon the base terminal carriers and the connecting units such that the receiving space, for example, would be formed half in the base terminal carrier and half in the connecting unit.

Preferably, one electronic housing is provided for each base terminal carrier. Alternatively, it is also conceivable that in the receiving space, which is formed in a lineup of base terminal carriers (see FIG. 6), there might be insertable or there might be inserted an electronic housing that would extend over several of the base terminal carriers.

It is furthermore also conceivable that one particular connecting unit would overlap several of the base terminal carriers (for example, in the manner of a pivotable cover with connecting devices for external conductors).

The design of the present invention also makes it conceivable to do without any locking of the electronics in the frame, which is formed from the U-shaped receiving space and the connecting unit that closes it off in the form of a strip. In a preferred embodiment, the side legs of the base terminal carrier furthermore form a common back wall and front wall. In this embodiment, the base terminal carrier forms a housing that closes around the electronic housing. Furthermore, it is preferred that the connecting modules have seals for the purpose of tightly closing the connecting module and/or several aligned connecting modules. When the base terminal carrier is in the closed form with additional seals, the connecting module can be produced with a high protection rating, for example, IP67.

Once again to be mentioned especially as an advantage is the possibility of making an upright wiring installation before the electronic unit is inserted. It is furthermore also conceivable to form an upright wiring installation with several interfaces (top, bottom, left, right) with respect to the electronics.

Preferably, the connecting module has contact elements for the electrical contacting of adjoining connecting modules that are lined up upon the connecting module, which connecting modules are provided in the base terminal carrier or in a contact module arranged in the base terminal carriers.

Also conceivable is a very small module length combined with an upright wiring installation and a simultaneously high channel density.

It is conceivable to operate or to move on the base terminal carrier the connecting level or the connection strip in a pivotable manner and/or by some other possibly also combined movement (swinging, plugging, pushing, axial, rotating). Single-handed operation—preferably without any tool—is also conceivable.

The trapezoidal shape of the receiving space toward the open side of the U in the base terminal carrier offers the additional advantage to the effect that by means of pressure on one or both side legs, the electronic with the electronic housing will be particularly easily separated from the base terminal carrier. The invention also relates to a lineup of the inventive connecting modules.

BRIEF DESCRIPTION OF THE DRAWINGS

Other objects and advantages of the invention will become apparent from a study of the following specification, when viewed in the light of the accompanying drawing, in which:

FIGS. 1a and 1b are right side and left side perspective views, respectively, of a first embodiment of the electrical module of the present invention;

FIG. 3a is a perspective view of the apparatus of FIG. 2e in an intermediate open condition, and FIG. 3b is a detailed view of the pivot means contained in zone A of FIG. 3a;

FIG. 3c is a perspective view illustrating the apparatus of FIG. 3a with the connector element removed;

FIG. 7b is a side elevation view of the apparatus of FIG. 7a.

FIG. 9a is partially-exploded perspective view of the apparatus of FIG. 8a; and FIG. 9b is an exploded view of the apparatus of FIG. 9a;

FIG. 10a is a perspective view of a stacked arrangement of the electrical modules of FIG. 8a.

FIGS. 11c and 11d are side elevation and top plan views, respectively, of the apparatus of FIG. 11a;

FIGS. 12c and 12d are side elevation and top plan views, respectively, of the apparatus of FIG. 12a; FIGS. 13c and 13d are side elevation and top plan views, respectively, of the apparatus of FIG. 13a.

DETAILED DESCRIPTION OF THE INVENTION

Figure 4A:
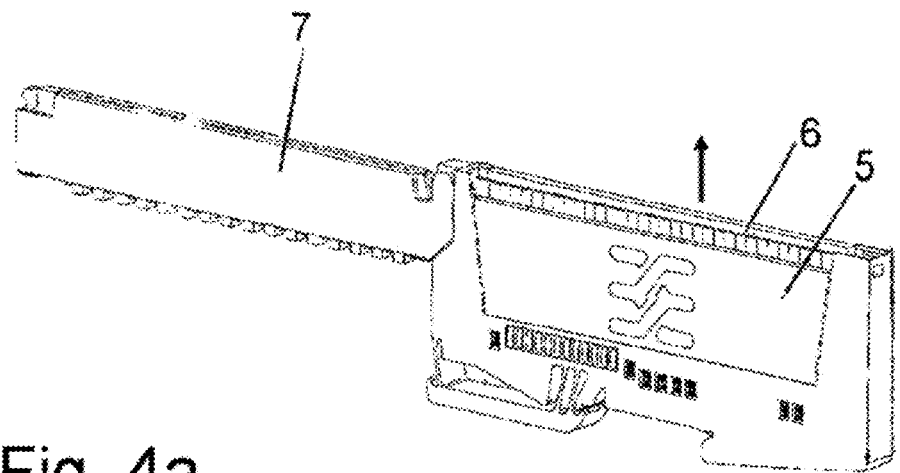
FIG. 4a is a perspective view of the apparatus of FIG. 3a with the connector element in the fully open position.
Figure 4B:
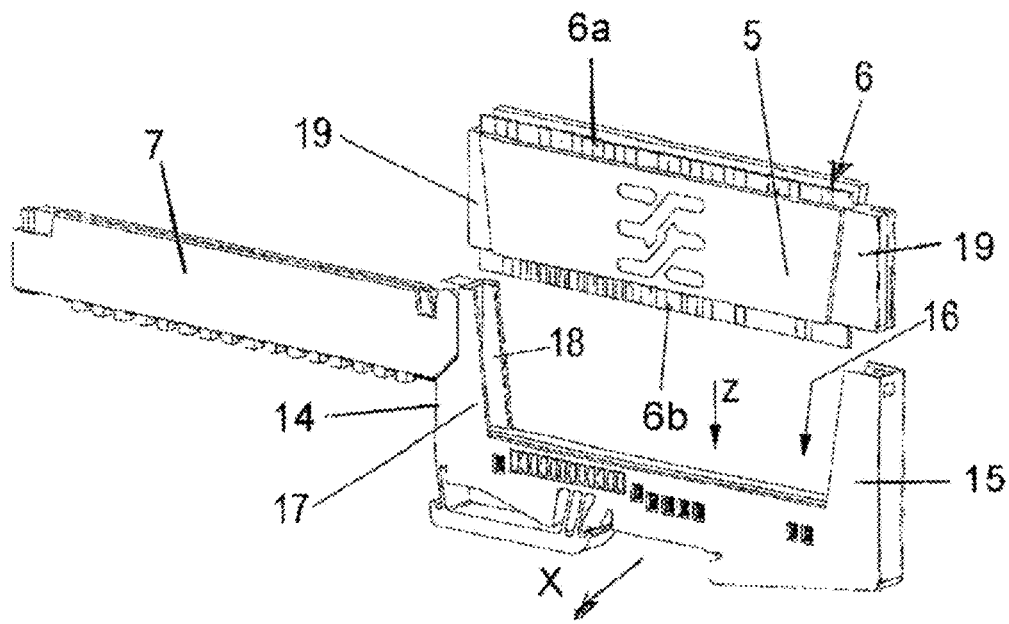
FIG. 4b is a corresponding perspective view with the electrical component removed from the carrier frame chamber.
Figure 7A:
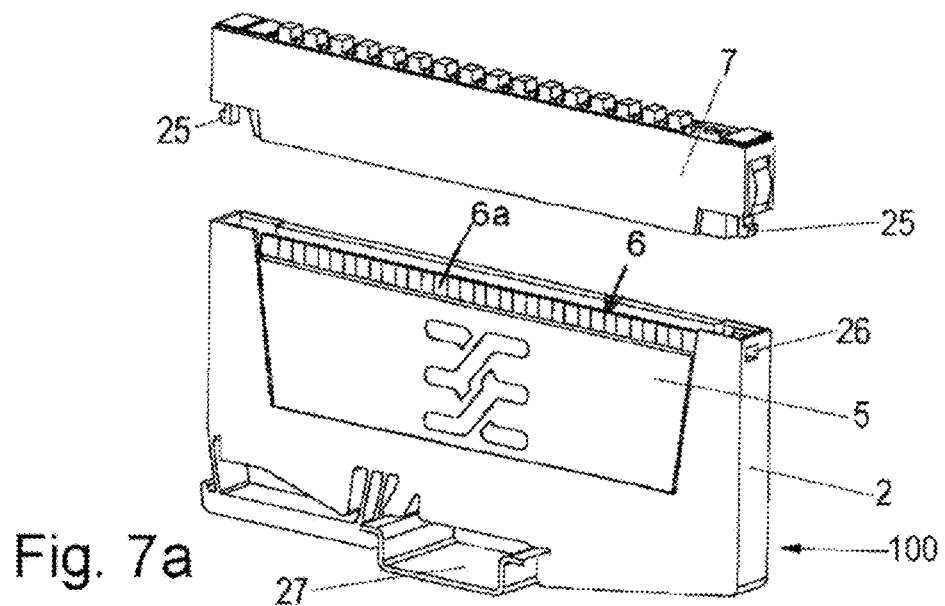
FIG. 7a is a partially-exploded perspective view of a second embodiment of the invention.
Figure 7B:
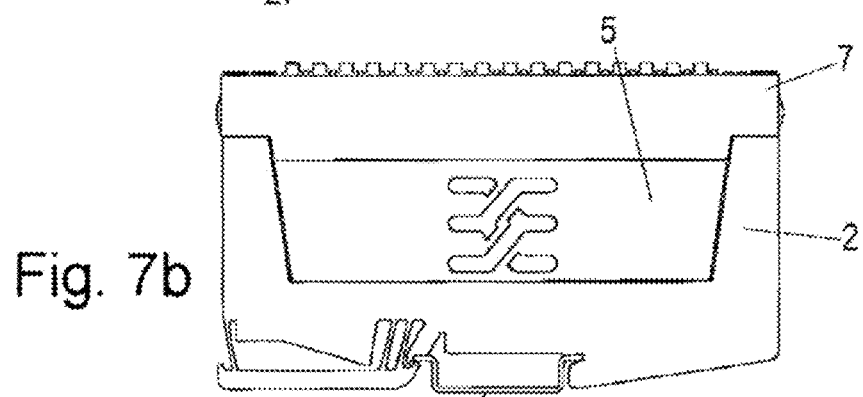
Figures 7C, 7D, 7E:
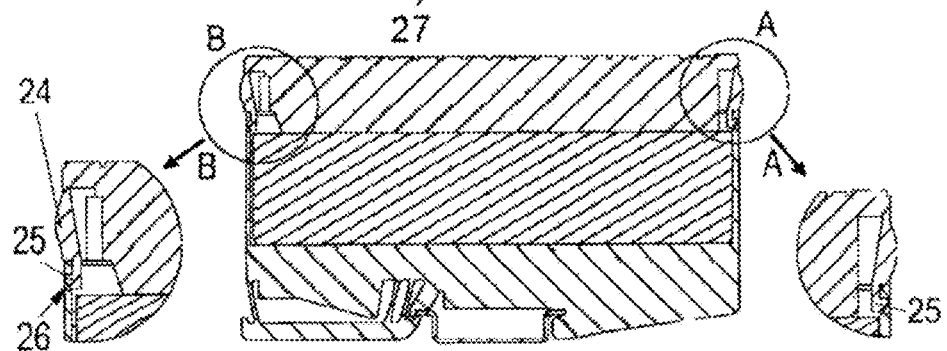
FIG. 7c is a sectional view of the apparatus of FIG. 7b.
FIGS. 7d and 7e are detailed views of the zones A and B of FIG. 7c, respectively.

Referring first more particularly to FIGS. 1a, 1b and 4b, the electrical module 1 of the present invention includes a carrier frame 2 of generally U-shaped configuration including a horizontal base portion 13, and a pair of vertical leg portions 14 and 15 that extend upwardly from the base portion and cooperate therewith to define a receiving chamber 16. The lower edge of the base portion contains a recess having mounting feet 3 and 4 for mounting the module transversely of and normal to a horizontal mounting rail (such as the mounting rail 27 of FIG. 7a). The carrier frame includes parallel spaced rear and front walls 17 and 18 that cooperate with carrier frame end walls to define a pair of vertical slots for slidably receiving the guide portions 19 provided at opposite ends of a sleeve-like open-ended housing 5. Mounted in the housing 5 is a printed circuit board 6 having upper and lower terminals 6a and 6b that extend above and below the housing 5. A connector unit 7 extends across the carrier frame 2, thereby to enclose and retain the housing 5 and the printed circuit board 6 in the chamber 16.

Figure 2A:
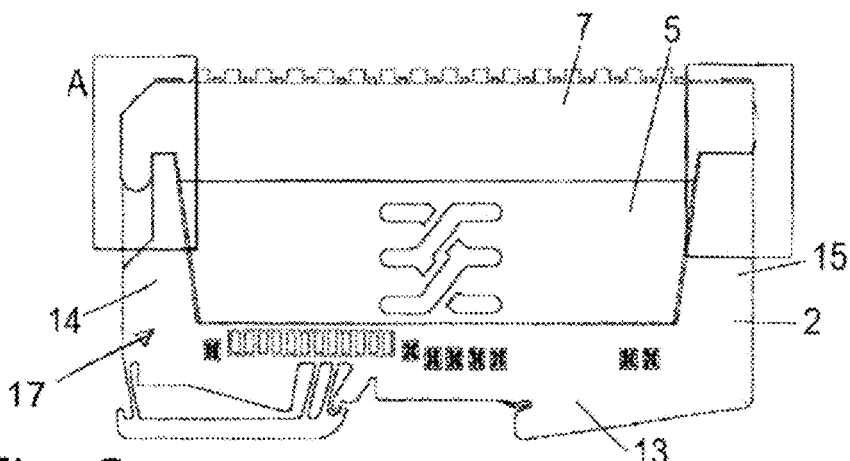
FIG. 2a is a right side elevation view of the electrical module of FIGS. 1a and 1b.
Figures 2B, 2C, 2D:
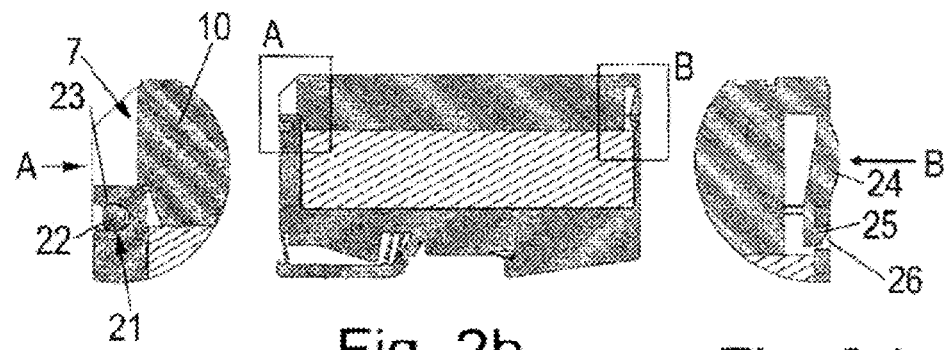
FIG. 2b is an outline view of the apparatus of FIG. 2a, and FIGS. 2c and 2d are detained views of the corner zones A and B of FIG. 2b, respectively.
Figure 2E:
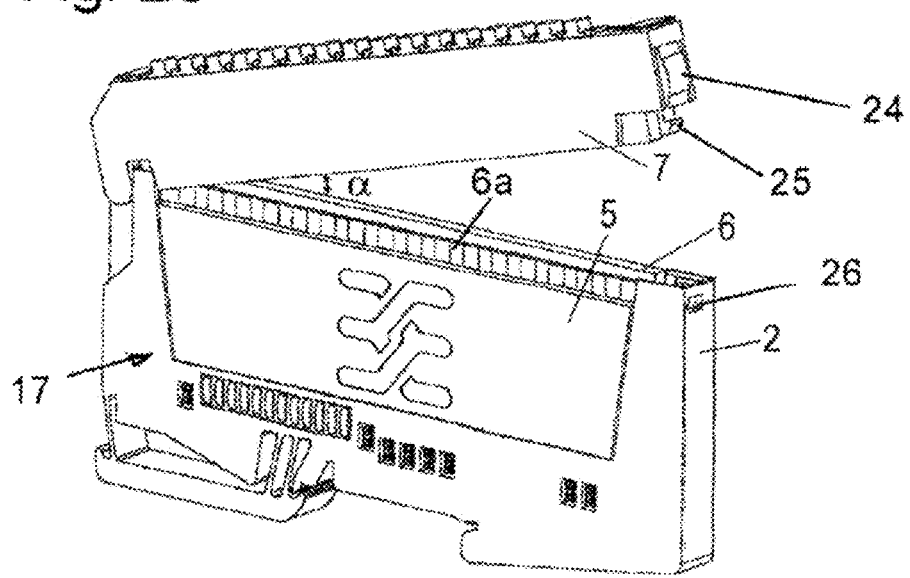
FIG. 2e is a perspective view of the apparatus of FIG. 2a with the connector in a partially open condition.

In the illustrated first embodiment of the invention, the connector unit 7 is pivotally connected at one end with the carrier frame 2 by pivot means 21 (FIG. 2c), whereby the connector unit 7 can be pivoted progressively from the fully closed position of FIG. 1a to the partially open intermediate positions of FIGS. 2e and 3a, and to the fully open position of FIG. 4a. These pivot means include a pivot rod 22 on the connector unit that extends into pivot bearings 23 contained in the leg portion 14 of the carrier frame. At its other end, the connector unit 7 is provided with fastener means for fasting the connector unit in the closed position with the carrier frame leg portion 15. These fastener means include a hook-shaped clasp 25 that is carried by the resilient finger-operated push button 24 and is normally biased to extend in locking engagement with a locking recess 26 contained in the end wall of carrier frame leg portion 15.

The connector unit 7 is provided on its lower side with a row of upper contacts (such as the contacts 13 of FIGS. 8c and 9a) that engage the upper terminals 6a of the circuit board 6, respectively, when the connector unit is in the closed position. As will be explained in greater detail below with reference to FIGS. 9b and 10c, the connector unit includes a row of conventional actuator buttons 9 for opening the associated upper contacts, respectively, thereby to permit the bare end of an external conductor C (FIG. 1b) to be inserted downwardly through a corresponding opening 8 contained in the connector unit for connection with a desired upper terminal 6a of the printed circuit board via the associated upper contact 13. The upper contacts are adapted for connection with auxiliary sensor units or the like via the external conductors C.

Figure 5A:
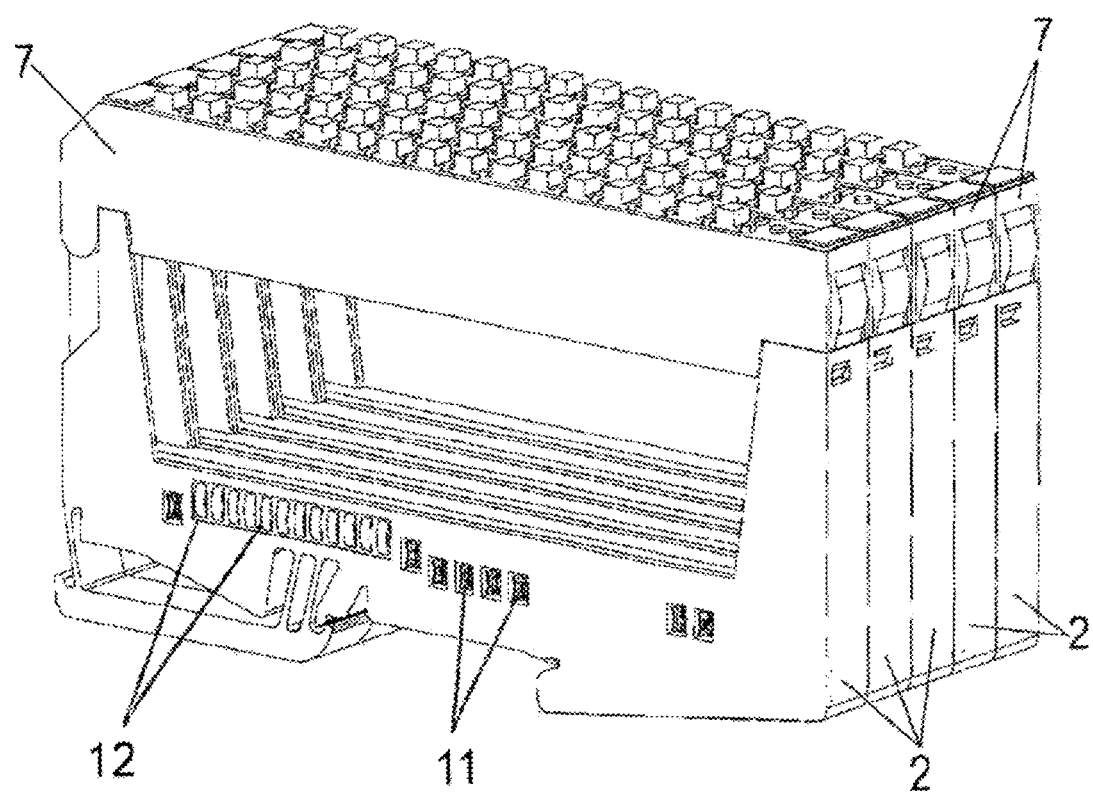
FIG. 5a is a perspective view of a stacked arrangement of the electrical modules with the electrical components removed, and with the connector members in the closed position relative to the associated frame members, respectively.
Figure 6A:
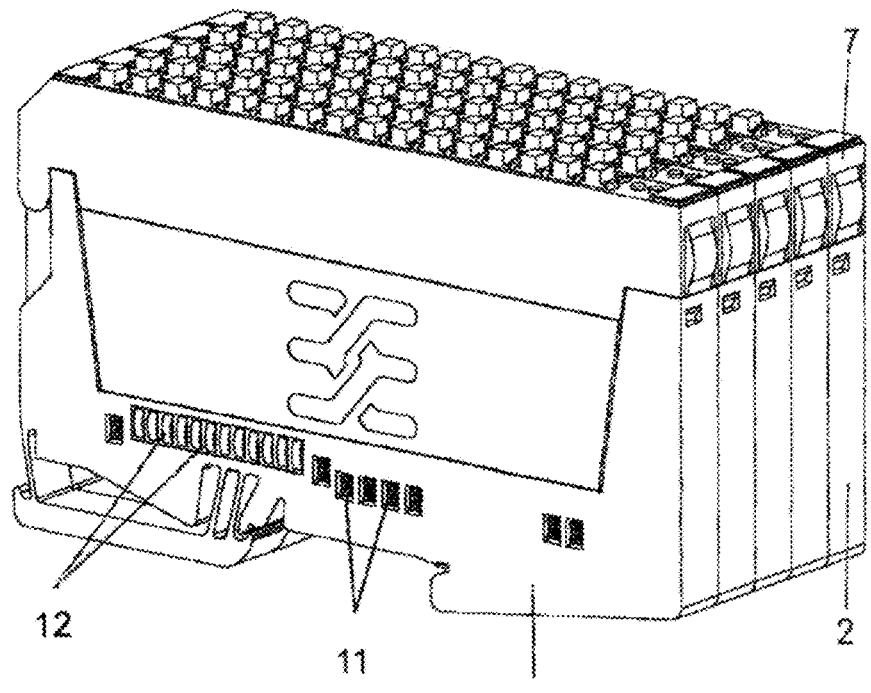
FIG. 6a is a perspective view of a plurality of stacked electrical modules.
Figure 6B:
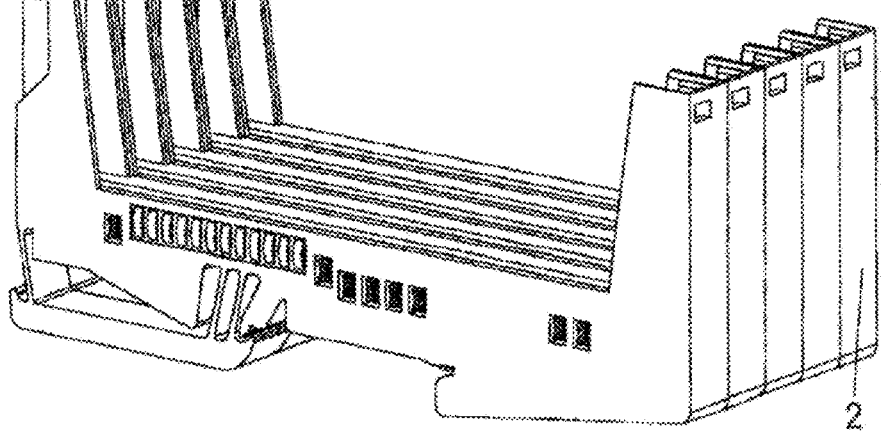
FIG. 6b is a perspective view of a plurality of stacked carrier frames.
Figure 6C:
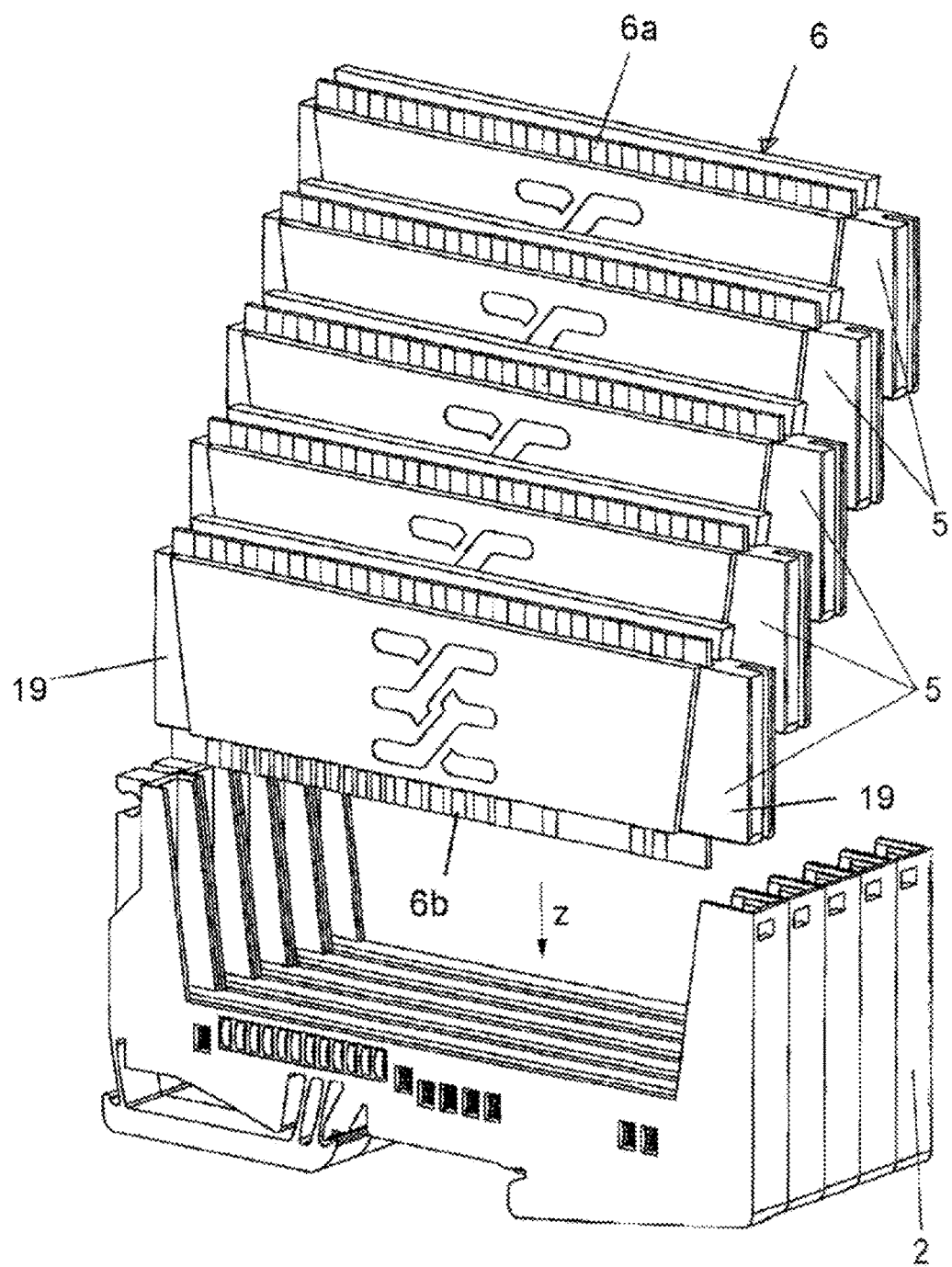
FIG. 6c illustrates the manner of insertion of the electrical components into the carrier frame chambers, respectively.

Similarly, the base portion 13 of the carrier frame 2 is provided with rows of lower contacts 11 and 12 (FIG. 9b) arranged below the receiving chamber 16 for connection with the lower terminals 6b of the printed circuit board. In the first embodiment, these lower contacts 11 and 12 extend slightly outwardly from chamber 16 via corresponding openings contained in the carrier frame side walls 18 and 19. Consequently, when a plurality of the carrier frames 2 are stacked together as shown in FIGS. 5a and 6b, or when a plurality of electrical modules are stacked together as shown inn FIG. 6a, the lower contacts 11 and 12 of one module will engage corresponding lower contacts of the adjacent stacked component. The contacts 11 and 12 are used to transmit intelligence signals to, or to supply energy between, the components.

Figure 6D:
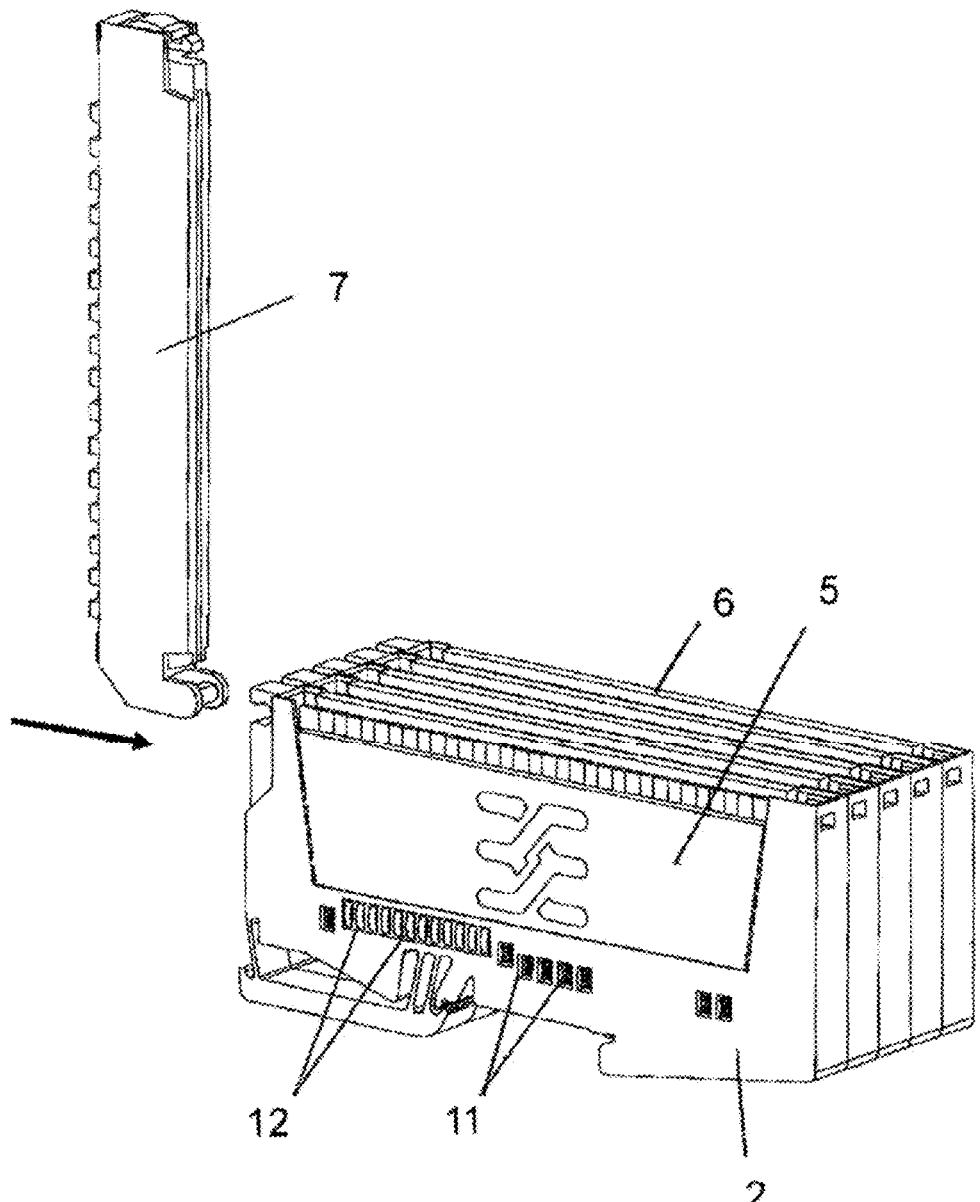
FIG. 6d is a perspective view illustrating the manner in which a connector element is connected with the assembly.

As shown in FIG. 3c, it is possible to remove the connector unit 7 from the carrier frame when the connector unit is in the open position and displaced in the Y direction. Similarly, as shown in FIG. 6d, the connector unit 7 may be displaced in the opposite Y direction for reconnection with the carrier frame.

The electrical connecting modules 1 that can be mounted on the mounting rail—in particular, in a lockable manner—and can be lined up next to each other on the mounting rail, which modules, by way of example, can be used in control systems for automation technology, where they are aligned upon a gateway. The combination of gateway and connecting modules facilitates the monitoring and/or control of external electrical units (field units, initiators, actuators, etc.), which can be connected to the connecting modules 1 of the invention-based electrical units.

Although the connecting modules 1 have been illustrated as being supported by a mounting rail, the invention is not confined to this kind of design. It is furthermore suitable also for use with aligned connecting modules mounted on another assembly base, for example, a wall or the like.

An electronic housing 5 with at least one or several printed circuit boards 6 (FIGS. 2e and 4b) is mounted upon or can be stuck upon the base terminal carriers 2, which circuit boards again can be stocked with electronic structural elements (FIG. 1a).

On the base terminal carrier frames 2 and on electronic housing 5, there is again mounted a connector unit 7 with a row of connecting devices for the connection of external conductors (not shown here). These connecting devices are preferably, but not necessarily, designed as connections by way of the push-in technique, which can be contacted without any tools merely by inserting a conductor into a contact point section of the connection. In the contacted state, a clamping leg of the push-in connection will clamp the conductor in a clamping cage against a bus bar. An actuation element 9 is used here for opening the connecting point, which lies below an opening 8 of housing 10 of the connecting unit.

Since only one single row of connecting devices 8 is provided, one can make a connecting module 1 with a particularly narrow structure in the direction of alignment.

But the invention is also suitable for connector units having several rows of connecting devices 8. The connecting devices can, in particular, also be made as IDC connections, extension spring connections, or screw connections.

Furthermore, the connector device can also be designed as at least one plug-and-socket connection upon which one can couple a corresponding plug-and-socket connection.

Both the base terminal carrier frame 2 and the electronic housing 5 as well as the connector unit 7 have a disc-like structure and can be lined up against each other normal to the plane in FIG. 2a.

Along with the connecting devices 8 of connecting unit 7 for the connection of external conductors of field units such as actuators, sensors and the like, each connecting module according to FIG. 1 or 2 preferably has several contact elements 11 of a first design for the implementation of a first internal bus running over several connecting modules in alignment direction X, and several contact elements 12 of a second design for the implementation of a second internal bus extending over several connecting modules in alignment direction X.

The second internal bus is preferably used for the transfer of data and possibly for the internal energy supply of the connecting module, whereas the first internal bus preferably is used to transfer energy in order, for example, to supply energy to the field units that are connected to the connecting devices 8.

Contact elements 11, 12, for example, can be push contacts or fork contacts/knife contacts. They can also have a third contact (pointing upward) for the contacting of the printed circuit board 6.

It is particularly advantageous that the base terminal carriers 2 in a side view in the direction of alignment (see, for example, FIG. 1a and FIG. 2a) display a kind of U-shape with a base leg 13 on which are molded the assembly means—catch means 3, 4—for assembly on the mounting rail and that spans the mounting rail preferably on both sides orthogonally with respect to the alignment direction. Here, two perpendicular side legs 14, 15 are molded upon the turned-away ends of the base legs 13 toward the side remote from the mounting rail, so that a receiving space 16 is formed between the base leg and the side legs (see also FIG. 4b in this regard). This receiving space 16 can be rectangular. Here, it is trapezoidal because the side legs 14, 15 are aligned at an angle with respect to each other on their sides that face toward each other.

Electronic housing 5 can be inserted in receiving space 16 and that electronic housing has a geometry that is adapted to the geometry of receiving space 16. Preferably, the edges 19 of electronic housing 5 are segmentally so shaped that they can be pushed between segments of a back wall 127 and a front wall 18 of side legs 14, 15 of base terminal carrier 2.

Inserted into electronic housing 5 is preferably a printed circuit board 6 which, upon being set on the base terminal carrier 2, will contact the latter's contacts, for example, by means of the fact that its marginal areas will engage with contact areas in corresponding contact areas in the base terminal carrier 2.

But it is also conceivable that one or several flat-positioned, partly plastic-sprayed bus bar or bus bars are used in place of the printed circuit board. Then wired electrical or electronic structural elements—for example, relays—can be soldered upon the bus bars.

It is advantageous that the side legs 14, 15 of the base terminal carrier additionally laterally frame the electronic housing 5 and at least one electronic printed circuit board 6.

Connector unit 7 can be mounted upon the base terminal carrier frame 2 specifically regardless of whether or not the electronic housing 5 has already been mounted on the base terminal carrier 2. Consequently, connector unit 7 can even be prewired and will simply only be opened in case the electronic unit or the electronic housing 5 must be assembled with or exchanged with the printed circuit board 6.

This opening—and a corresponding closing action—can be done in various ways. According to one variant, connector unit 7 is positioned movably, in particular, pivotally, on the base terminal carrier frame 2. In this way, the connector unit 7 is connected with a side leg 14 via a pivot arrangement bearing 21 for the purpose of pivotally connecting the connector unit 7 on base terminal carrier frame 2, according to FIGS. 1 to 6.

Here, pivot means 21 includes a a pivot pin 22 on housing 10 of the connector unit 7 and a receiving space 23 as the bearing eye in one of the side legs 14 (see FIG. 2c). This receiving state 23 is laterally opened and is so dimensioned that the axis 22 can be locked into it or can be swung into it and by opening the catching action can again be removed (see, in particular, FIGS. 3a to 3c and FIG. 6d).

On the other side of leg 15, there can be a separable lock. This lock is here formed by a catch key 24 with catch hook 25 and a catch recess 26 in side leg 15 (FIG. 2d), which catch key can be activated, for example, by finger pressure or the like.

The pivot means, at any rate, are so dimensioned that the swing angle α will suffice to take off the connecting strip in order to insert and/or change the electronics. Preferably, printed circuit board 6 protrudes out of electronic housing 5 toward base terminal carrier 2 and toward connection unit 7.

FIG. 2e illustrates the opening of the connecting module 1 after the pressing of catch key 24 by an initially still small opening angle α.

Figure 5B:
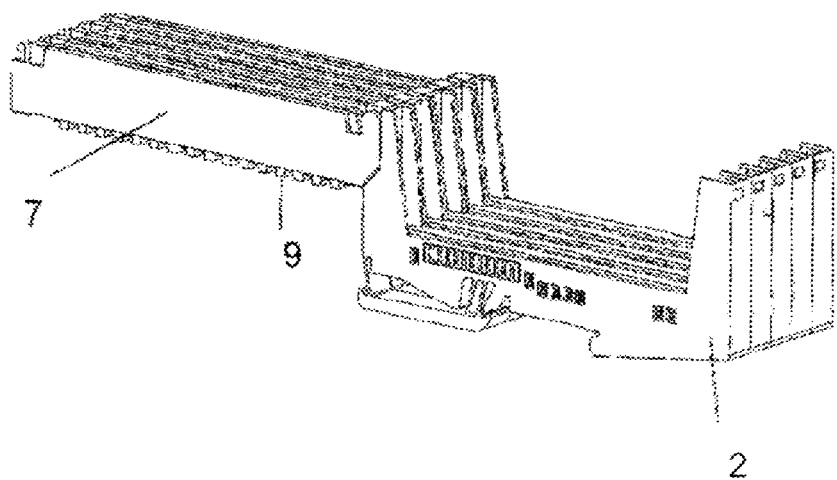
FIG. 5b is a corresponding perspective view with the connector members pivoted to the open position.
Figure 5C:
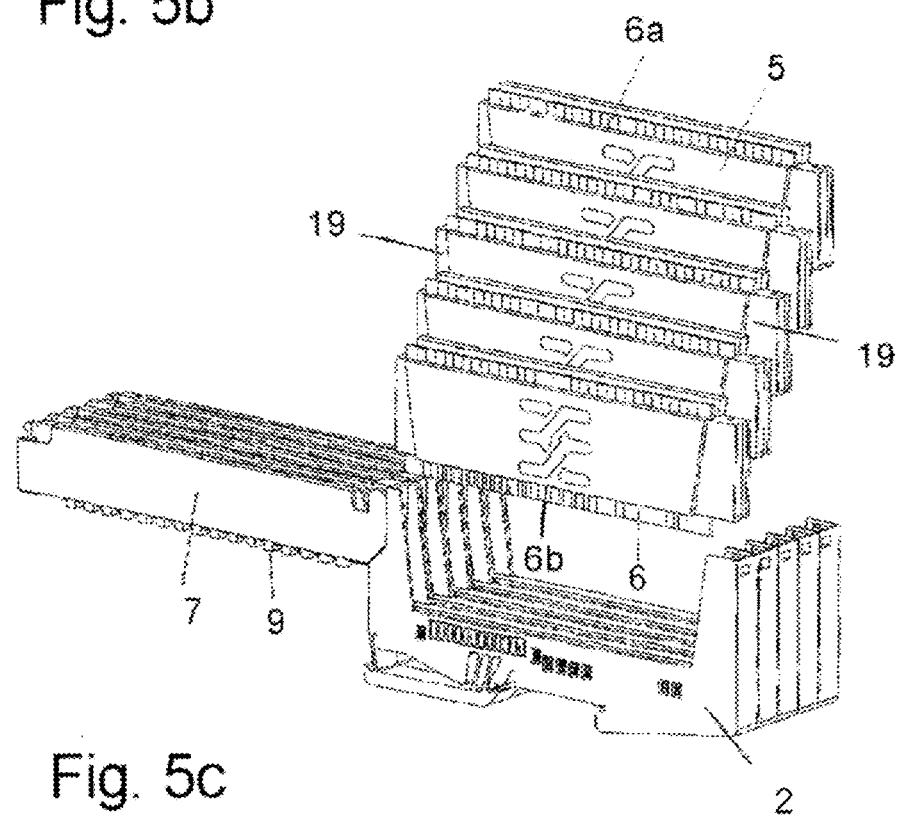
FIG. 5c is a perspective view illustrating the manner of insertion of the electrical components into the carrier frame chambers, respectively.

FIG. 3a shows a 90° opening in a preferably defined, self-retaining open position. In this position, axis 22, which is made flattened, can be taken out toward the side out of the receiving space 23 that serves as bearing eye (upward in direction Z FIG. 4a) in order to exchange it or also in order to assemble it for the first time (FIGS. 4, 5, and 6).

FIG. 4b shows the electronic housing 5 above base terminal carrier 2. FIG. 5 shows that basically one can in a preassembled manner for a lineup consisting of base terminal carriers 2 with the corresponding connecting units 7 before the electronic housing 5 can be inserted in them.

As particularly advantageous, one might mention here the resultant option to the effect that the wiring of the connecting units or the connection of external conductors to the connecting units can be done prior to the insertion of the electronic unit. Basically, the entire wiring setup can be "swung up" to the side with the connection unit 7 (FIG. 5a, b, c).

During the first assembly, as a rule, the base terminal carrier frames 2 are mounted on the mounting rail (FIG. 6). Then the electronic housings 5 (FIG. 6c), and the connector units 7 are added (FIG. 6d) and are closed in order to form the alignment consisting of connecting modules 1 with electronic housings 5 as shown in FIG. 2a.

In the modification of FIGS. 7a-7e, instead of a pivotal connection, the connector unit 7 is removably connected with the carrier frame by fastener hooks 25 provided at each end of the connector unit. Furthermore, as an alternative, the connector units could be mounted on the base terminal carrier 2 in a different way, for example, by means of a bayonet lock or the like (not illustrated here).

Figure 8A:
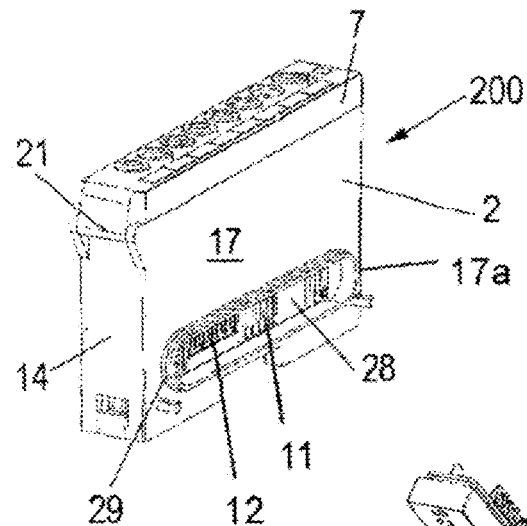
FIG. 8a is a perspective view of a third embodiment of the electrical module in the closed condition.
Figure 8B:
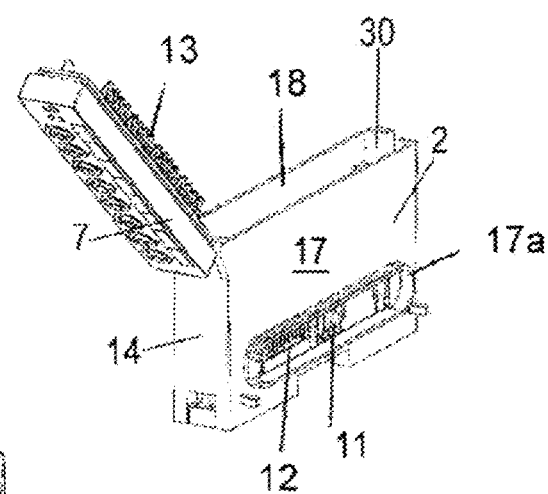
FIG. 8b is a corresponding view with the connector element in the open position.
Figure 8C:
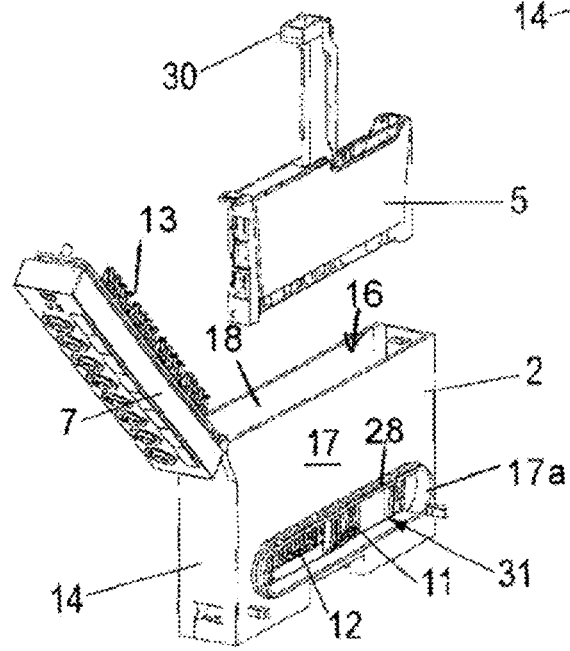
FIG. 8c is a partially exploded view of the apparatus of FIG. 8b.
Figure 9A:
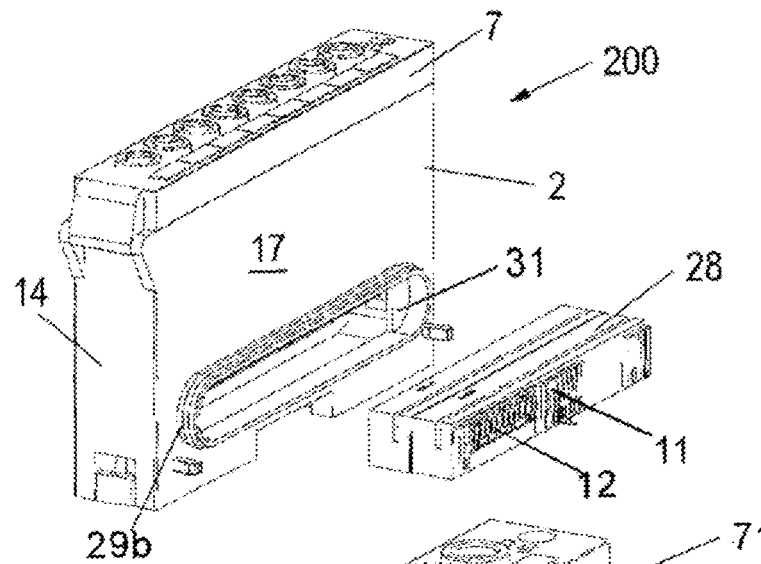
Figure 9B:
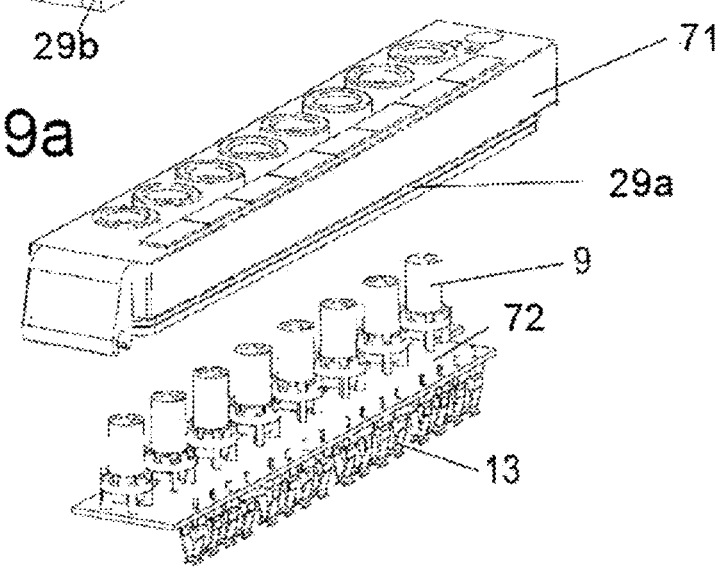

FIGS. 8a-8c illustrate a connecting module 200 according to the present invention wherein the side legs 14, 15 of base terminal carrier 2 form a common back wall 17 and front wall 18. In FIG. 8a, electronic housing 5 and connector unit 7 are arranged in the locked position upon base terminal carrier frame 2. In FIG. 8b, connector unit 200 is in the open position, and FIG. 8c shows connector unit 200 with the electronic housing 5 removed.

In the embodiment shown here, connector unit 7 is arranged on base terminal carrier frame 2 so that it can be pivoted about the pivot means 21. On electronic housing 5, there is provided a handle 30 in the form of a grip to facilitate the insertion and extraction of electronic housing 5 into and out of the base terminal carrier frame 2.

On base terminal carrier frame 2, there is arranged here a contact module 28 with which are provided contact elements 11, 12 that facilitate an electrical contacting of the connecting module 200 upon an adjoining, mutually aligned connecting module (see FIG. 10). Contact elements 11, 12 are accessible through a wall opening 31.

Figure 9B:
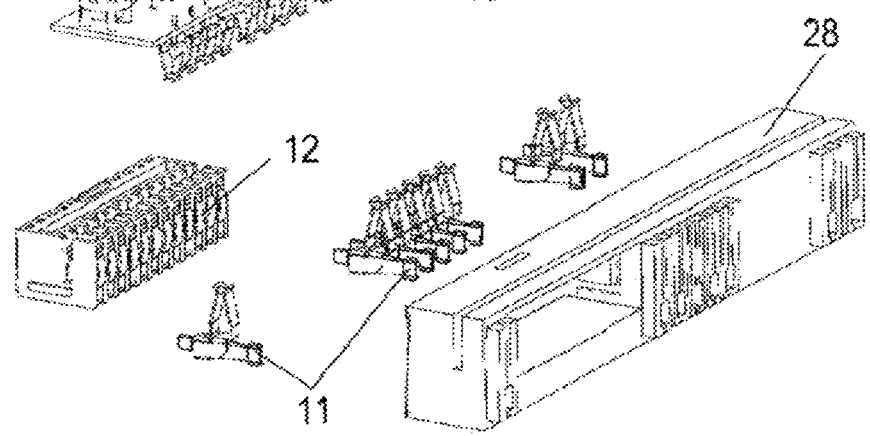

FIG. 9 shows the components of base terminal carrier 2 of connecting module 200 shown in FIG. 8. Here the contact module with the contact elements 11, 12 can be inserted into the contact module. FIG. 9 shows that connector unit 7 here is formed by a housing part 71 and an electronic part 72. On electronic part 72, there are provided actuation elements 9 and contact elements 13 for the electrical contacting of the electronic housing 5.

On housing part 71 of connecting unit 7 and on wall opening 31 of base terminal carrier 2, there is in each case provided an upper seal 29a that facilitates the sealing closing of connecting module 200 and/or of an adjoining connecting module (see FIG. 10) in order to facilitate a higher protection class when compared to the embodiments of connecting module 1, 100 in FIGS. 1-7.

Figure 10A:
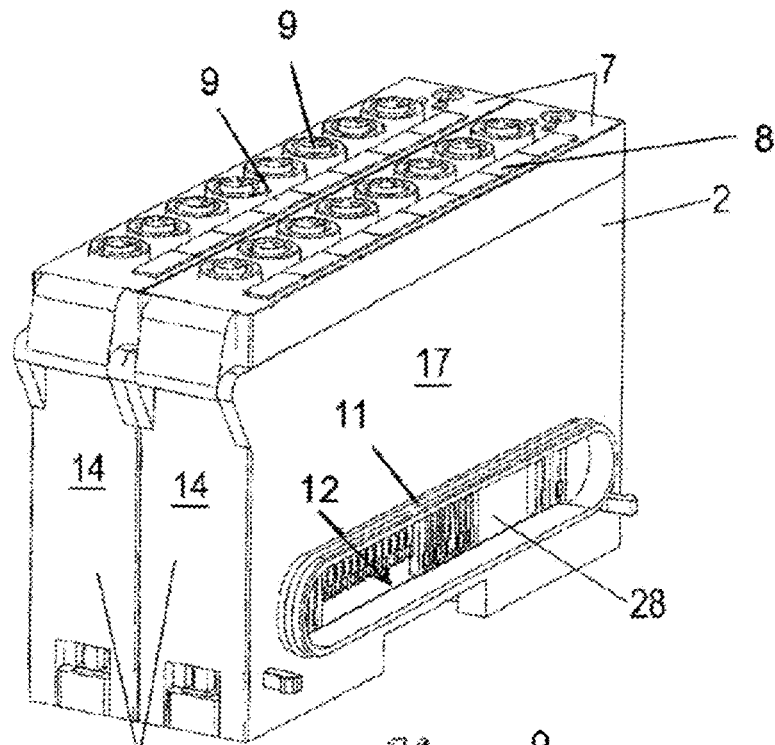
Figure 10B:
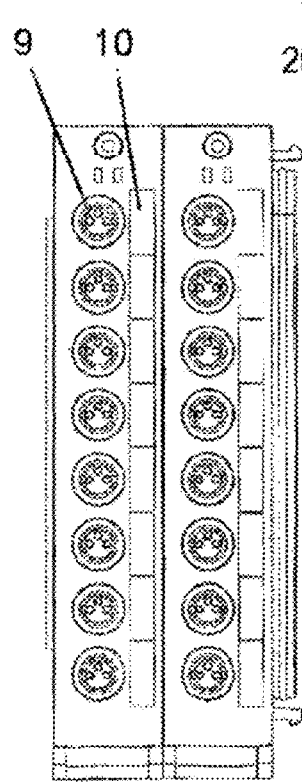
FIGS. 10b and 10c are top plan and sectional views of the apparatus of FIG. 10a, respectively.
Figure 10C:
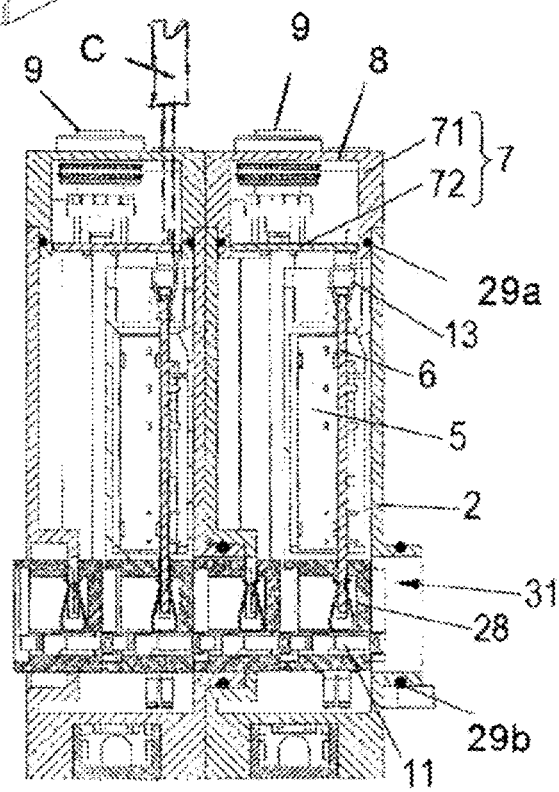
Figure 11A:
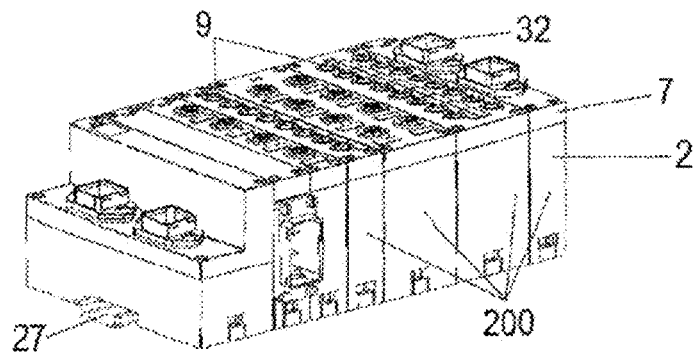
FIGS. 11a and 11b are left and right perspective views of a stacked assembly of electrical modules mounted on a support rail.
Figure 11B:
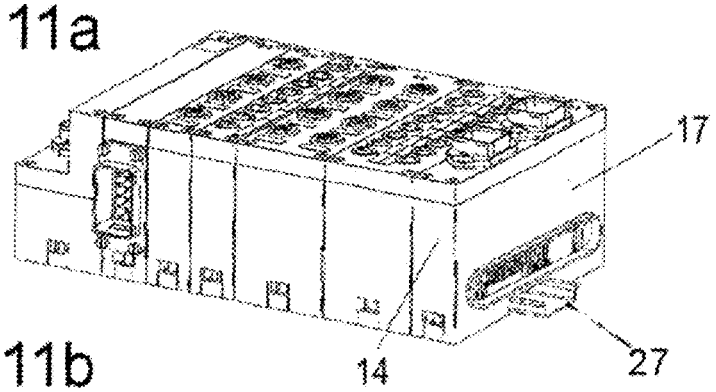
Figure 11C:
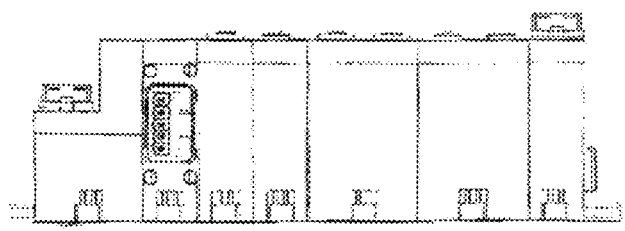
Figure 11D:
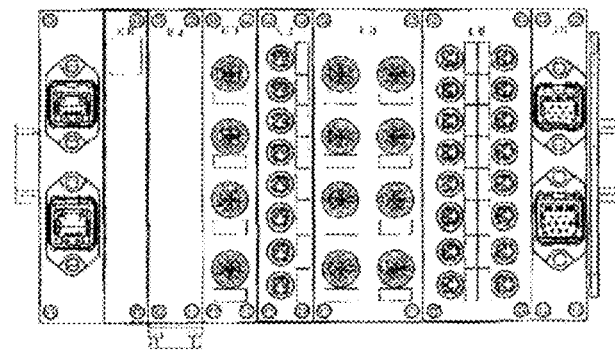
Figure 12A:
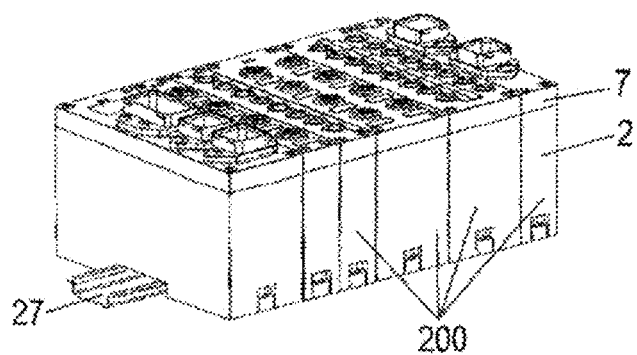
FIGS. 12a and 12b are left and right perspective views of a stacked assembly of electrical modules mounted on a support rail.
Figure 12B:
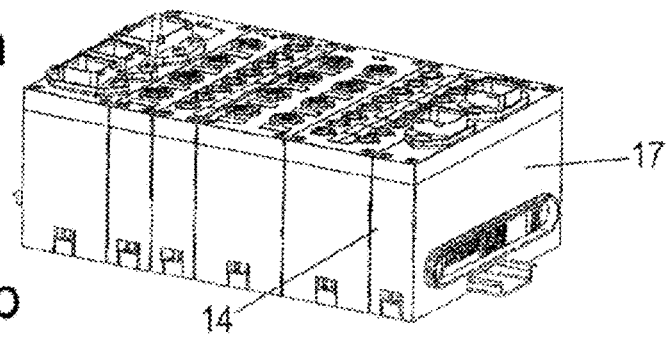
Figure 12C:
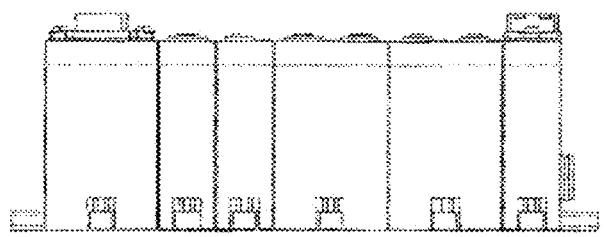
Figure 12D:
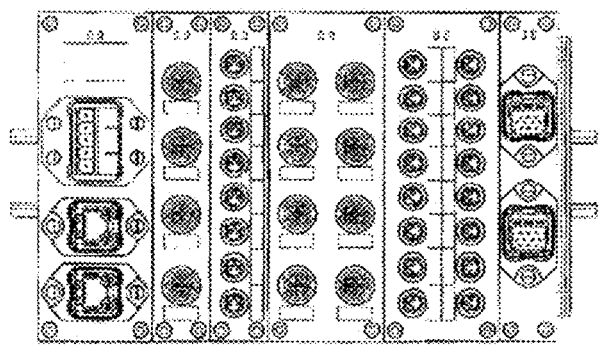
Figure 13A:
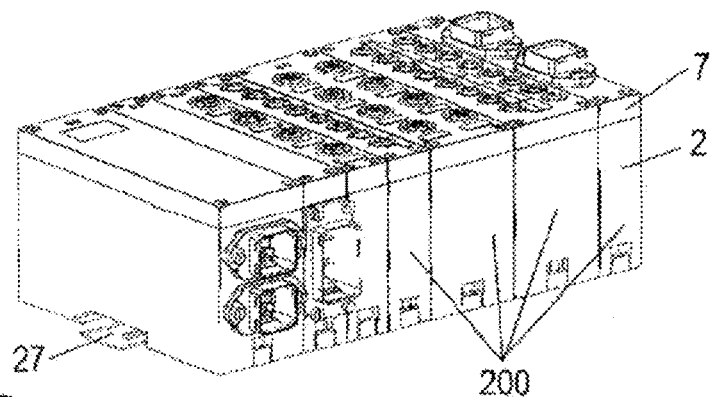
FIGS. 13a and 13b are left and right perspective views of a stacked assembly of electrical modules mounted on a support rail.
Figure 13B:
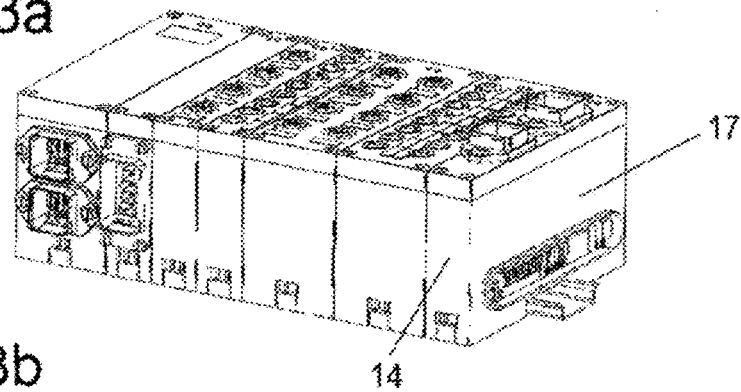
Figure 13C:
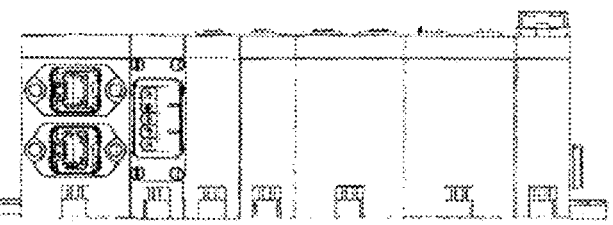
Figure 13D:
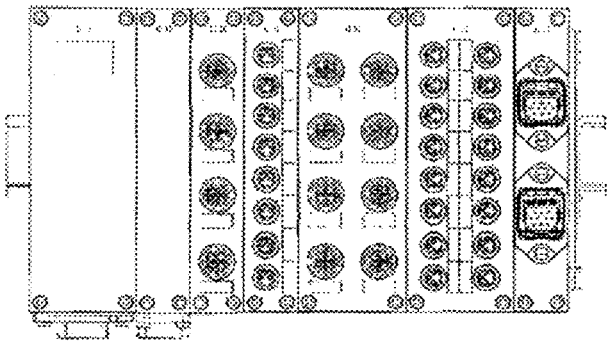

FIG. 10 shows two mutually aligned connecting modules 200 from FIG. 8, specifically in FIG. 10a in a perspective view, in FIG. 10b in a top view, and in FIG. 10c in a sectional taken through the two adjoining connecting modules 200.

FIG. 10c shows the electronic housing 5 arranged in the receiving space 16 of base terminal carrier 2 with the printed circuit board, housing part 71, and electronic part 72 of connecting unit 7, whereby upon electronic part 72, there are provided contact elements 13 that contact printed circuit board 6 electrically and contact module 28 with its contact elements 11 that electrically contact printed circuit board 6, and wall openings 31 in front wall 18 as well as in back wall 17 are accessible through contact elements 11 of contact module 28 toward the adjoining contact module 200.

Besides, O-ring seals 29 are shown that facilitate the high protection class associated with the arrangement. Here, the upper seal 29a arranged on connecting unit 7 facilitates a sealing locking action between connecting unit 7 and base terminal carrier 2, and lower seal 29b arranged on wall opening 31 facilitates a tight closing between mutually adjoining, mutually aligned connecting modules 200.

FIGS. 11-13 show various embodiments of connecting modules 200 that are lined up on a bus bar 27 with in each case base terminal carriers 2 whose side legs 14, in each case form a common back wall 17 and front wall 18. The connecting modules differ from each other in each case with respect to their contacting, actuation and/or connecting elements 9, 11-13, 32.

In the above description, it should be noted that various preferred versions have been described in detail; however, the present invention is not confined to these designs, but instead can be shaped in various ways. In particular, such terms as "horizontal", "vertical", "top," "bottom," "front," or "back" are not to be construed in any restrictive manner, but instead relate merely to the particular illustrated arrangement. Moreover, when individual components are explained, they—unless otherwise indicated—are basically also conceivable in multiple shapes. The area of protection furthermore also includes kinematic reversals of the illustrated arrangements.

While in accordance with the provisions of the Patent Statutes the preferred forms and embodiments of the invention have been illustrated and described, it will be apparent to those skilled in the art that changes may be made without deviating from the invention described above.

What is claimed is:

1. An electrical module (1; 100; 200) adapted for mounting on a horizontal support rail (27), comprising:
    (a) a rectangular carrier frame (2) adapted for vertical transverse mounting on the support rail, said carrier frame containing an open-topped chamber (16);
    (b) a vertical electrical component (6);
    (c) a housing (5) mounting said electrical component vertically in said carrier frame chamber, said housing comprising a rectangular open-ended sleeve extending concentrically around said electrical component, said electrical component including upper and lower terminals (6a; 6b) extending above and below said sleeve, respectively; and
    (d) electrical connector means (7) mounted on and extending across the upper end of said carrier frame, said connector means being electrically connected with said electrical component.

2. An electrical module as defined in claim 1, wherein said carrier frame is generally U-shaped and includes a horizontal longitudinal base portion (13), and a pair of vertical end portions (14; 15); and further wherein said housing includes guide means (19) guiding said housing for vertical displacement between said carrier frame end portions.

3. An electrical module as defined in claim 1, wherein said connector means includes:
    (1) a generally rectangular connector body (71); and
    (2) a connector contact assembly (72) including a plurality of upper contacts (13) carried by said connector body for engagement with corresponding upper terminals (6a) of said electrical component, respectively.

4. An electrical module as defined in claim 3, wherein said connector means further includes :
    (3) means (8, 9) for electrically connecting the bare ends of an plurality of insulated conductors (C) to said upper contacts, respectively.

5. An electrical module as defined in claim 1, wherein said housing includes handle means (30) for inserting and removing said housing relative to said carrier frame chamber.

6. An electrical module as defined in claim 1, and further including:
    (e) connecting means for connecting said electrical connector means with said carrier frame.

7. An electrical module as defined in claim 6, wherein said connecting means includes fastener means (25, 26) for fastening at least one first end of said connector body with said carrier frame when said connector body is in said closed position.

8. An electrical module as defined in claim 7, wherein said connecting means includes pivot means (21) for connecting a second end of said connector body with said carrier frame, thereby to permit pivotal displacement of said connector body between closed and open positions relative to said carrier frame.

9. An electrical module as defined in claim 6, and further including upper seal means (29a) for sealing the space between said connector body and said carrier frame.

10. An electrical module as defined in claim 1, and further including:
    (e) a plurality of lower contacts (11, 12) mounted in the bottom of said carrier frame chamber, said lower contacts being in engagement with said electrical component lower terminals, respectively, said carrier frame chamber having side walls (17, 18) containing access openings affording access to said lower contacts.

11. An electrical module as defined in claim 10, and further including:
    (f) a contact support member (28) supporting said lower contacts in said carrier frame chamber opposite opposed wall openings (31) contained in said carrier frame side walls, one of said carrier frame side walls having a protruding flange portion (17a) surrounding the associated wall opening and extending outwardly therefrom, whereby when a plurality of said electrical modules are mounted on the support rail, the flange portion of one module will extend into the corresponding opening contained in the adjacent side wall of the adjacent module.

12. An electrical module as defined in claim 11, and further including:
    (g) lower seal means (29b) for sealing the space between said side wall flange portion of one module and the opening contained in the adjacent wall of the adjacent module.

13. An electrical module as defined in claim 1, wherein said electrical component is a printed circuit board.

* * * * *